(12) United States Patent
Jain et al.

(10) Patent No.: US 7,687,338 B2
(45) Date of Patent: Mar. 30, 2010

(54) METHOD OF REDUCING EMBEDDED SIGE LOSS IN SEMICONDUCTOR DEVICE MANUFACTURING

(75) Inventors: Sameer Jain, Beacon, NY (US);
Shreesh Narasimha, Beacon, NY (US);
Karen A. Nummy, Newburgh, NY (US);
Viorel Ontalus, Danbury, CT (US);
Jang H. Sim, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 11/950,572

(22) Filed: Dec. 5, 2007

(65) Prior Publication Data

US 2009/0148988 A1 Jun. 11, 2009

(51) Int. Cl.
*H01L 21/336* (2006.01)
(52) U.S. Cl. .................. 438/197; 438/220; 438/300; 257/E21.64; 257/E21.182; 257/E21.207; 257/E21.626; 257/900
(58) Field of Classification Search ............... 438/267, 438/179, 220, 300; 257/E21.64, 626, 182, 257/207
See application file for complete search history.

(56) References Cited

U.S. PATENT DOCUMENTS

| 6,551,948 | B2 * | 4/2003 | Ohmi et al. ............... 438/778 |
| 6,696,334 | B1 | 2/2004 | Hellig et al. |
| 6,881,990 | B2 | 4/2005 | Tsuno |
| 2006/0073665 | A1 * | 4/2006 | Jain ....................... 438/303 |

OTHER PUBLICATIONS

T. Ghani et al. "A 90nm High Volume Manufacturing Logic Teechnology Featuring Novel 45nm Gate Length Strained Silicon CMOS Transistors", IEDM Techincal Digest, pp. 978-980, 2003.*

* cited by examiner

*Primary Examiner*—Charles D Garber
*Assistant Examiner*—Yasser A Abdelaziez
(74) *Attorney, Agent, or Firm*—Yuanmin Cai

(57) ABSTRACT

Embodiments of the invention provide a method of forming embedded silicon germanium (eSiGe) in source and drain regions of a p-type field-effect-transistor (pFET) through a disposable spacer process; depositing a gap-filling layer directly on the eSiGe in the source and drain regions in a first process; depositing a layer of offset spacer material on top of the gap-filling layer in a second process different from the first process; etching the offset spacer material and the gap-filling layer, thus forming a set of offset spacers and exposing the eSiGe in the source and drain regions of the pFET; and finishing formation of the pFET.

20 Claims, 7 Drawing Sheets

METHOD OF REDUCING EMBEDDED SIGE LOSS IN SEMICONDUCTOR DEVICE MANUFACTURING

FIELD OF THE INVENTION

The present invention relates generally to semiconductor device manufacturing. In particular, it relates to method of reducing losses of SiGe embedded in source and drain regions during process of manufacturing of p-type field-effect-transistors.

BACKGROUND

In semiconductor device manufacturing field, efforts of scaling devices such as transistors, and particularly field-effect-transistor (FET) devices, have recently been focused on improving stress engineering to the devices. For example, when a p-type FET (pFET) device is manufactured, silicon-germanium (SiGe) may be embedded (eSiGe) in source and drain regions of the pFET device as stressors, which have successfully demonstrated their effectiveness in improving performance of the pFET device. However it is noted that, while this eSiGe process or technology is considered as useful in improving performance of pFET devices, it is generally not applicable to other types of devices such as, for example, n-type FET (nFET) devices which may be manufactured together with pFET devices.

FIGS. 8-11 illustrate a conventional method or process of manufacturing pFET and nFET together, with eSiGe technology being applied only to the pFET for performance enhancement. In particular, FIG. 8 illustrates a step of forming pFET 310 and nFET 410 on a common substrate, which may include substrates 301 and 401 illustrated separately in FIG. 8 for description purpose. pFET 310 may include gate 303, adjacent oxide spacers 304, and source/drain regions 302 wherein SiGe may be embedded (eSiGe). Conventionally, eSiGe 302 in the source/drain regions of pFET 310 is formed through a disposable spacer process, which generally results in no oxide spacers being left on top of eSiGe 302. On the other hand, nFET 410, which may be manufactured together with pFET 310, may have an oxide spacer 404 covering not only gate 403 but also source/drain regions 402 of nFET 410, as illustrated on the right side of FIG. 8.

Following forming eSiGe 302, conventionally, a layer of oxide material (306, 406) may be deposited on top of pFET 310 and nFET 410, as illustrated in FIG. 9, to form offset spacers. After the deposition, the oxide layer (306, 406) may be subjected to a directional etching process (309, 409) as illustrated in FIG. 10, such as a reactive-ion-etching (RIE) process. The directional etching process forms offset spacers 307 and 407, as illustrated in FIG. 11, and expose source and drain regions of pFET 310 and nFET 410 for further treatment. For example, with regard to nFET 410, oxide layer 406 may be removed first and oxide spacer 404 may be removed next from the top of source/drain regions of nFET 410. However, during the removal of spacer 404, SiGe embedded in the source/drain regions of pFET 310 (eSiGe 302), because the top thereof is not covered by oxide spacer 304, may be subjected to or exposed to the same processing conditions as those for removing spacer 404. As a result, the directional etching process may cause erosion 308, or damage, or over-etch, as illustrated in FIG. 11, of eSiGe 302 of pFET 310. This ultimately may cause performance degradation in the final finished pFET product.

Therefore, there exists in the art a need to develop new and/or improved method and/or process that may be applied in forming field-effect-transistors, and in particular in forming pFET and nFET together, with pFET being enhanced by embedded SiGe process with reduced or minimal eSiGe erosion during the process of manufacturing thereof.

SUMMARY OF THE EMBODIMENTS

Embodiments of the present invention provide a method of forming field-effect-transistors. The method includes forming embedded silicon germanium (eSiGe) in source and drain regions of a p-type field-effect-transistor (pFET) through a disposable spacer process; depositing a gap-filling layer directly on the eSiGe in the source and drain regions in a first process; depositing a layer of offset spacer material on top of the gap-filling layer in a second process different from the first process; etching the offset spacer material and the gap-filling layer, thus forming a set of offset spacers and exposing the eSiGe in the source and drain regions of the pFET; and finishing formation of the pFET.

According to one embodiment, the first process is a self-limiting oxidation process and depositing the gap-filling layer includes growing oxide on top of the eSiGe in the source and drain regions by the self-limiting oxidation process. Furthermore, the method includes growing more oxide on top of the eSiGe of the pFET than on top of a layer of oxide, the layer of oxide directly covering source and drain regions of a n-type field-effect-transistor (nFET) concurrently manufactured.

According to another embodiment, the oxide grown on top of the eSiGe of the pFET has a thickness substantially similar to a combined thickness of the oxide grown on top of the layer of oxide, covering source and drain regions of the nFET, and the layer of oxide.

In one embodiment, the self-limiting oxidation process is a slot-plate-antenna (SPA) process. In another embodiment, the self-limiting oxidation process is a low temperature plasma deposition process.

According to yet another embodiment, etching the gap-filling layer includes etching the gap-filling layer concurrently with etching an oxide layer which is directly on top of source and drain regions of a n-type field-effect-transistor (nFET) concurrently manufactured with the pFET, wherein the oxide layer on top of the source and drain regions of the nFET has a height that is substantially the same as that of the gap-filling layer.

In one embodiment, etching the offset spacer material includes applying a directional etching process to remove at least a portion of the offset spacer material deposited on top of the source and drain regions. In one embodiment, directional etching process is a reactive-ion-etching (RIE) process.

Embodiment of the present invention provides a method of forming at least a p-type field-effect-transistor (pFET) and at least an n-type field-effect-transistor (nFET) on a common substrate. The method includes forming embedded silicon germanium (eSiGe) in source and drain regions of the pFET through a disposable spacer process; the disposable spacer process leaving a layer of oxide on top of source and drain regions of the nFET; depositing a gap-filling layer, in a first process, on the eSiGe in the source and drain regions of the pFET and on the layer of oxide on top of the source and drain regions of the nFET; depositing a layer of offset spacer material on top of the gap-filling layer in a second process different from the first process; etching the offset spacer material and the gap-filling layer, thus forming offset spacers and exposing respective the source and drain regions of the pFET and the nFET; and finishing formation of the pFET and the nFET.

According to one embodiment, the first process is a self-limiting oxidation process and the depositing a gap-filling layer comprises growing oxide on the eSiGe in the source and drain regions of the pFET and growing oxide on the layer of oxide covering the source and drain regions of the nFET.

In one embodiment, the method includes growing significantly more oxide on the eSiGe of the pFET than on the layer of oxide that covers the source and drain regions of the nFET. In another embodiment, the oxide grown on the eSiGe of the pFET has a thickness substantially similar to a combined thickness of the oxide grown on the layer of oxide and the layer of oxide.

According to one embodiment, the gap-filling layer is an oxide layer, deposited through a self-limiting oxidation process, having a thickness over the source and drain regions of the pFET being different from a thickness over the source and drain regions of the nFET.

According to another embodiment, etching the gap-filling layer includes etching the gap-filling layer concurrently with etching the layer of oxide which is on top of the source and drain regions of the nFET, the layer of oxide having a height that is substantially the same as that of the gap-filling layer. According to yet another embodiment, etching the offset spacer material includes applying a directional etching process to remove a portion of the offset spacer material deposited on top of respective the source and drain regions of the pFET and the nFET.

BRIEF DESCRIPTION OF THE DRAWINGS

The present invention will be understood and appreciated more fully from the following detailed description of the invention, taken in conjunction with the accompanying drawings of which.

Figure 1:
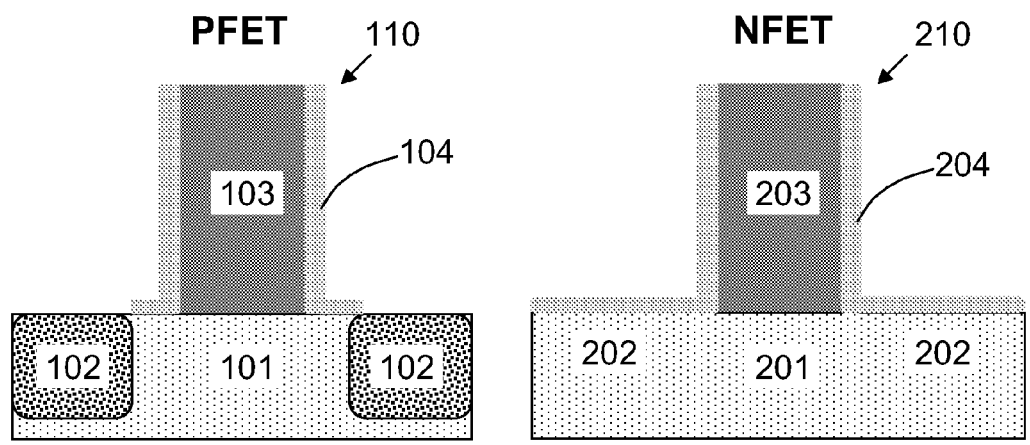
FIGS. 1-5 are demonstrative illustrations of a method of manufacturing field-effect-transistors according to embodiments of the present invention.

It will be appreciated by a person skilled in the art that for simplicity reason and for clarity of illustration, elements shown in the drawings have not necessarily been drawn to scale. For example, dimensions of some of the elements may be exaggerated relative to other elements for clarity purpose.

DETAILED DESCRIPTION OF EMBODIMENTS

In the following detailed description, numerous specific details are set forth in order to provide a thorough understanding of embodiments of the invention. However, it will be understood by those of ordinary skill in the art that embodiments of the invention may be practiced without these specific details. In other instances, well-known methods and procedures have not been described in detail so as not to obscure the embodiments of the invention.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be construed as limitation to the invention.

FIGS. 1-5 are demonstrative illustrations of a method of manufacturing field-effect-transistors according to embodiments of the present invention. In particular, FIG. 1 illustrates a sample step of forming field-effect-transistors such as, for example, pFET 110 and nFET 210. pFET 110 and nFET 210 are formed on a common substrate which may include substrate 101 and substrate 201, which are illustrated separately in FIG. 1 for description purpose. Being manufactured or formed on a common substrate, pFET 110 and nFET 210 may experience same or similar processing steps and/or processing environment during manufacturing as explained below in more details.

pFET 110 may include gate 103 and source/drain regions embedded with SiGe (eSiGe) 102 for stress engineering purpose. eSiGe 102 may be self-aligned to the source and region regions of pFET 110 through a disposable spacer process as is well known in the art. The disposable spacer process may leave oxide spacer 104 (reox) at the two sides of gate 103 of pFET 110, but not on top of the source/drain region where eSiGe 102 is formed. In the meantime, nFET 210, being formed on the same substrate as that of pFET 110, also undergoes the same manufacturing process, which may create an oxide spacer 204 (reox) covering both gate 203 and top of regions 202 that are designated as areas for forming source and drain of nFET 210. Oxide spacer 204 may be substantially similar in thickness to oxide spacer 104.

Figure 2:
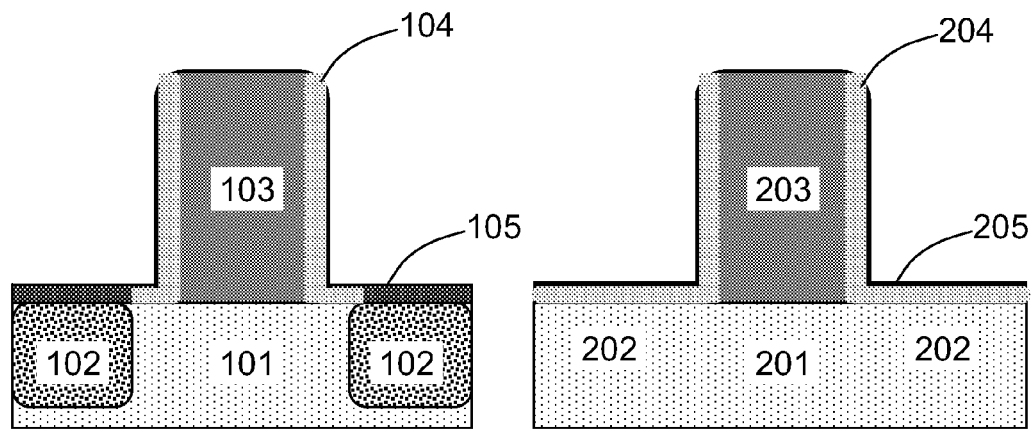

FIG. 2 illustrates a step of manufacturing pFET 110 and nFET 210 following the formation of eSiGe 102 of pFET 110 according to embodiments of the present invention. A gap-filling layer 105 may be formed on top of eSiGe 102 of pFET 110. According to one embodiment, gap-filling layer 105 may be formed thinner on top of spacer 104 than in areas directly on top of eSiGe 102 through, for example, a self-limiting oxidation process. For example, slot-plate-antenna (SPA) process, which is a self-limiting oxidation process or a low temperature plasma oxidation process, may be used, prior to a next offset spacer deposition process, to grow oxide layer 105 mainly on the source and drain regions 102 of pFET 110 without causing a significant grow of oxide layer on top of oxide spacer 104 and oxide layer 205 on top of oxide spacer 204 of nFET 210. In other words, gap-filling oxide layer 105 and oxide layer 205 may be grown in such a way that, after the SPA process, pFET 110 may have an oxide layer 105 and nFET 210 may have a combined oxide layer 204 and 205, on top of their respective source and drain regions, which have thicknesses that are significantly similar to each other.

Here, it is worth noting that a person skilled in the art will appreciate that the present invention may not be limited in the above respects. For example, the use of a SPA process as presented above may be one of many feasible options and/or examples for forming gap-filling layer 105. Other known or future developed techniques may be used to form gap-filling layer 105, which may be formed selectively in thickness on different materials such as eSiGe 102 and oxide of spacer 104 and/or 204. In addition, materials other than oxide (e.g., nitride) may be used for forming gap-filling layer 105 and so the process of forming gap-filling layer 105 may not be limited to oxidation processes. In general, materials having similar etch rate as the material of existing spacers 204 (in this case oxide) are preferred in forming gap-filling layer 105.

Figure 3:
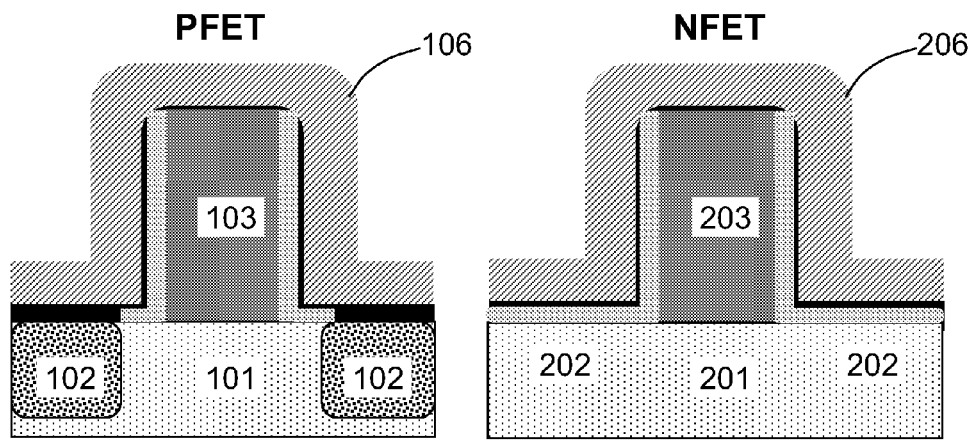
Figure 4:
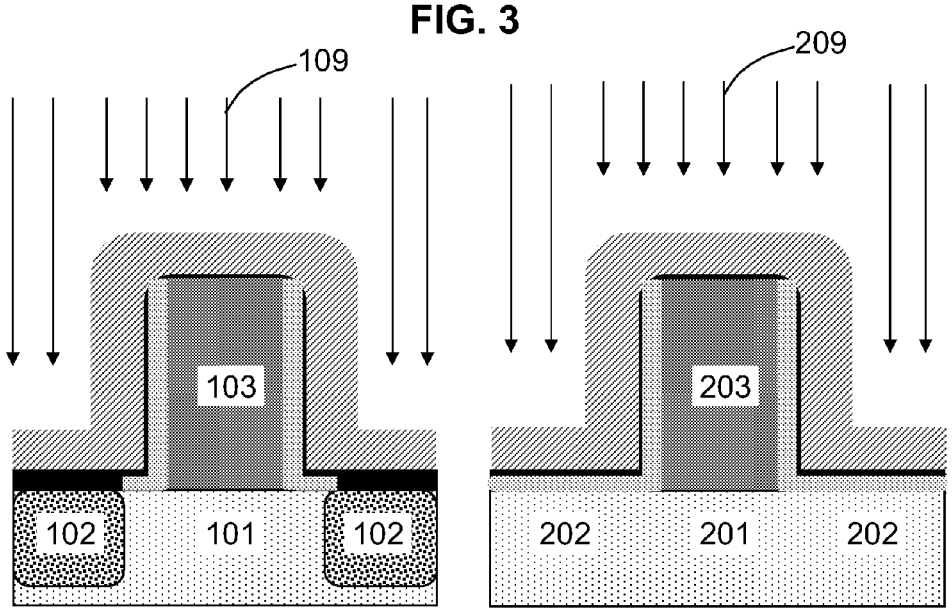

FIG. 3 illustrates a step of manufacturing pFET 110 and nFET 210 following the formation of gap-filling layer 105. A layer of material (e.g., oxide or nitride) suitable for forming offset spacers may be deposited on top of pFET 110 and nFET 210. For example, oxide layer 106 may be deposited on top of pFET 110 and oxide layer 206 may be deposited on top of nFET 210. The oxide layer may next be subjected to a directional etching process (109, 209) as illustrated in FIG. 4. The directional etching process may be a reactive-ion-etching (RIE) process that removes the oxide spacer materials from top of the source and drain regions of pFET 110 and nFET 210, and those on top of the gates thereof. Next, oxide in the source and drain regions of both pFET 110 (such as 105) and nFET 210 (such as 205 and 204) may be removed to expose the underneath source/drain regions for further processing and/or treatment. In case that nitride is selected for forming offset spacers, the removing of nitride and oxide may be achieved by selecting a different mixture of chemicals used in the RIE as is known in the art, and the process may be controlled by end-point monitoring.

Figure 5:
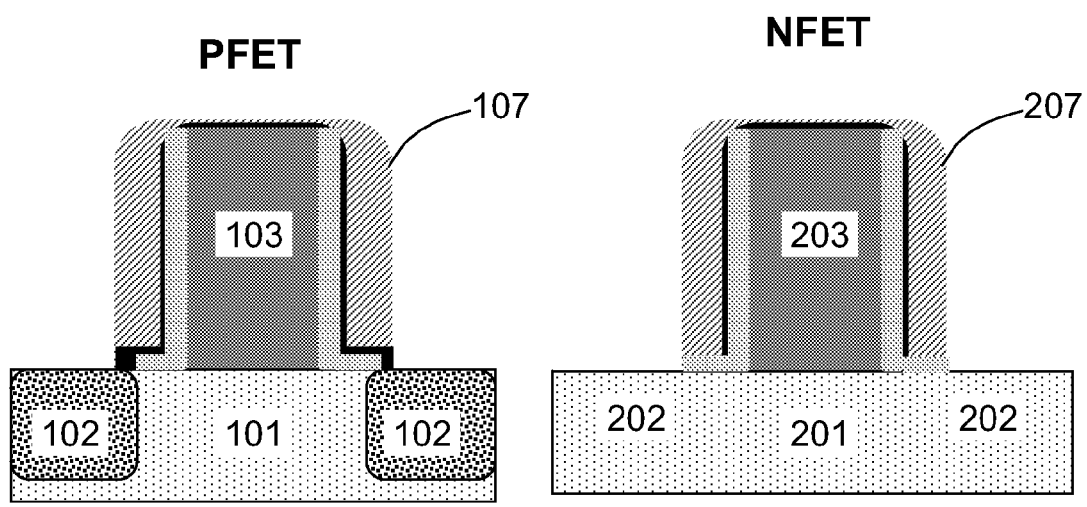

Because the oxide to be removed from the top of source and drain regions of pFET 110 has approximately the same thickness as, or significantly similar thickness to, that of the combined oxide layer (204 and 205) on top of the source and drain regions of nFET 210, according to embodiments of the present invention, damage to eSiGe (of pFET 110), which may be caused by over-etch during removal of oxide from top of nFET 210 in a conventional method or process, may be significantly reduced and/or limited, and/or eliminated in an ideal situation. As illustrated in FIG. 5, the RIE process may create offset spacers 107 and 207 adjacent to gate 103 and 203 of pFET 110 and nFET 210 respectively, with their respective source and drain regions properly exposed with minimal erosion.

Following the formation of offset spacers 107 and 207, other well-known processing may be applied in subsequent steps to finish forming pFET 110 and nFET 210. Such steps (not shown) may include, for example, applying halo-implantation to form source/drain extensions, followed by creating source/drain spacers, and then forming source/drain for the devices.

Figure 6A:
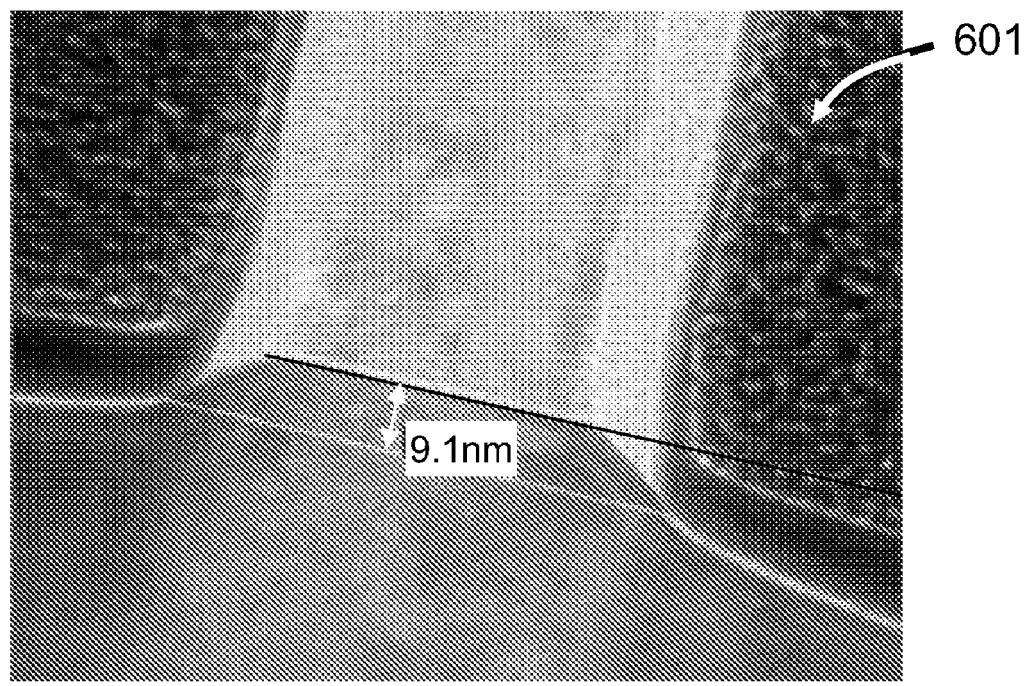
FIG. 6A is a sample SEM image of cross-sectional area of field-effect-transistor manufactured according to the prior art.
Figure 6B:
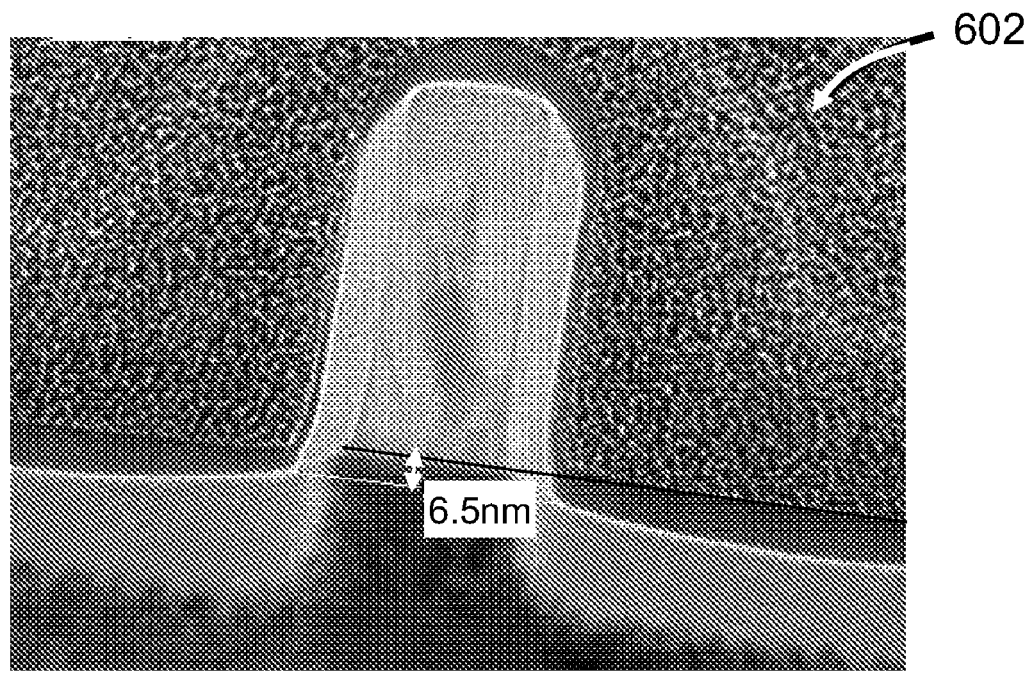
FIG. 6B is a sample SEM image of cross-sectional area of field-effect-transistor manufactured according to embodiments of the present invention.

FIG. 6A is a sample SEM image of cross-sectional area of field-effect-transistor manufactured according to the prior art, and FIG. 6B is a sample SEM image of cross-sectional area of field-effect-transistor manufactured according to embodiments of the present invention. SEM image 601 of FIG. 6A illustrates a recess in the source/drain regions of a pFET, manufactured according to the prior art, of about 9.1 nm. In comparison, SEM image 602 of FIG. 6B illustrated a pFET manufactured according to embodiment of the present invention. As is indicated in FIG. 6B, pFET 602 has a much reduced recess or erosion of eSiGe in the source/drain regions, of approximately 6.5 nm, which is generally consistent with those observed in other nFET devices (not shown) concurrently manufactured on the same substrate. In other words, it has been demonstrated that embodiments of the present invention is able to reduce eSiGe erosion in the source/drain regions of pFET effectively.

Figure 7:
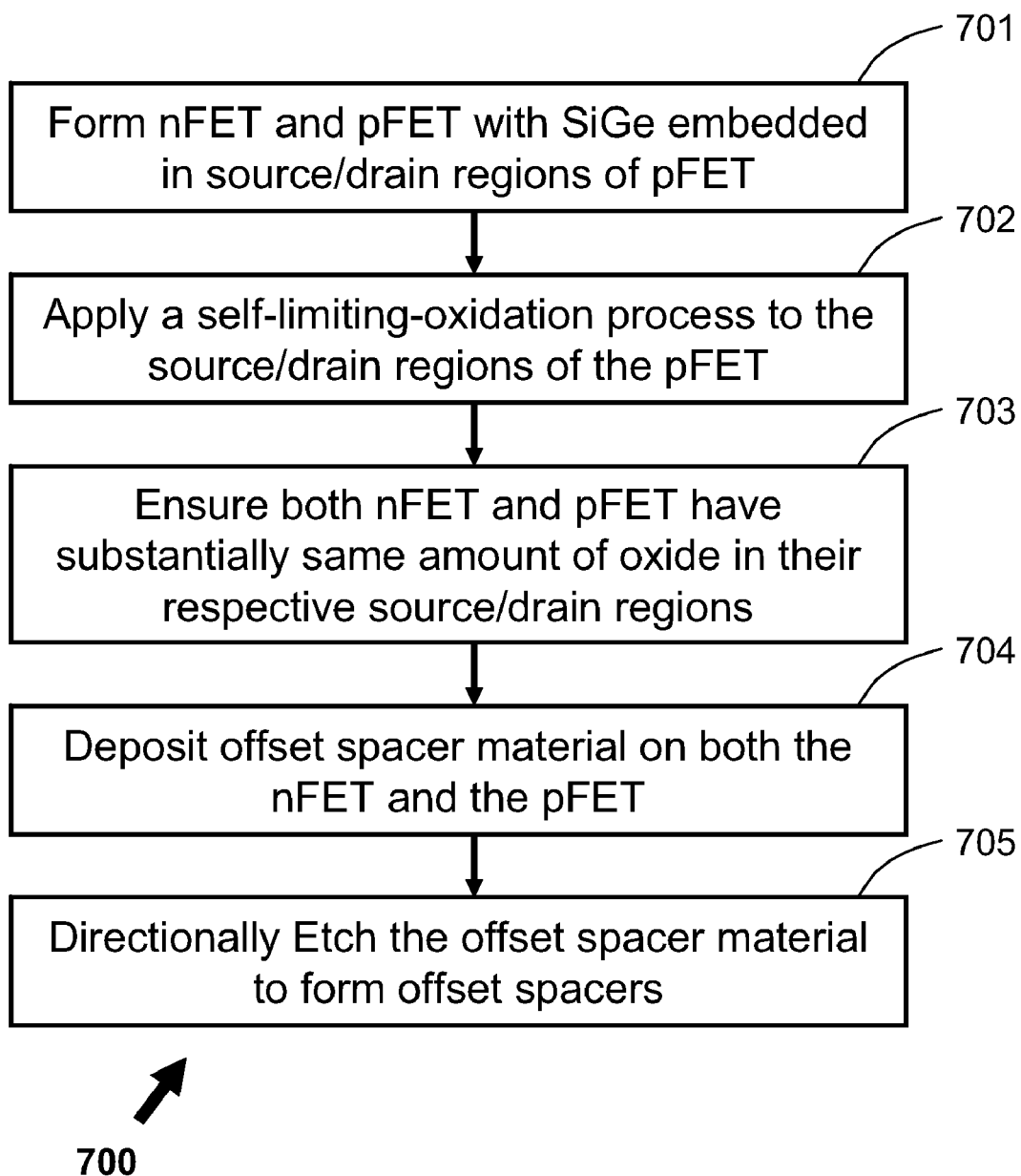
FIG. 7 is a simplified flowchart of a method of manufacturing field-effect-transistors according to embodiments of the present invention.
Figure 8:
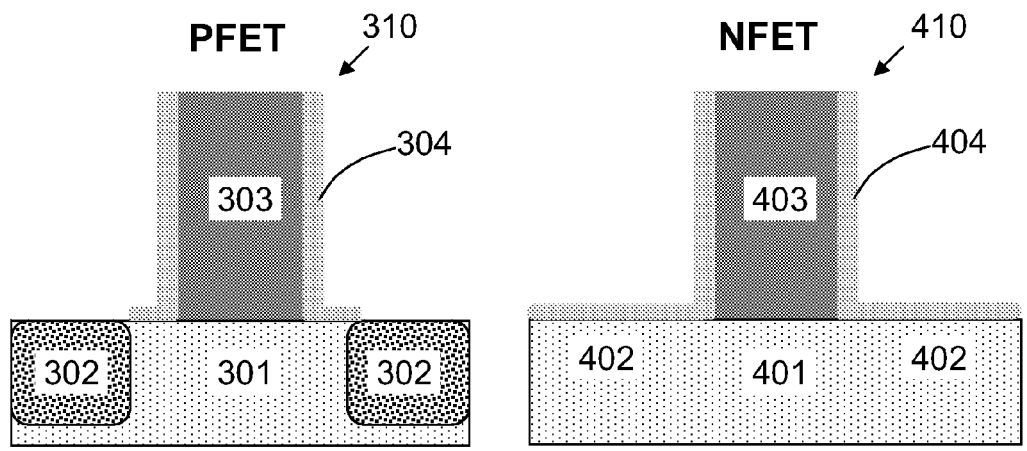
FIGS. 8-11 are simplified illustrations of a method of manufacturing field-effect-transistors as is known in the art.
Figure 9:
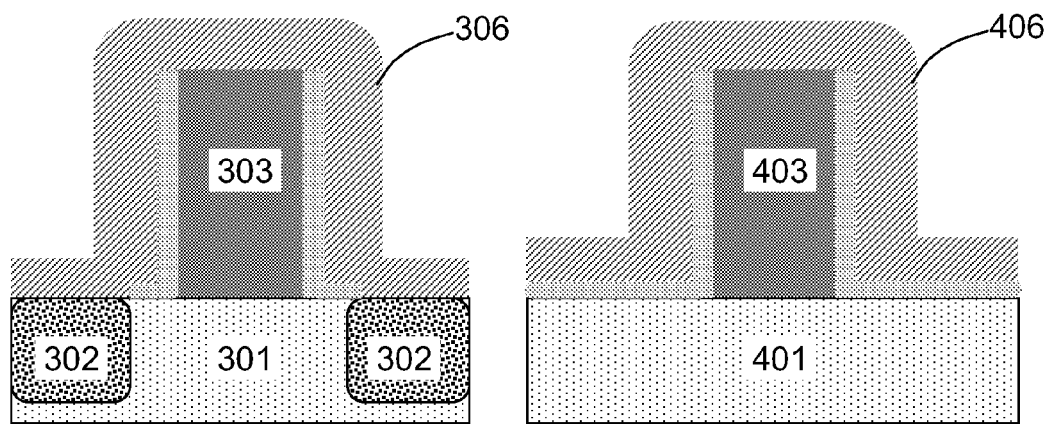
Figure 10:
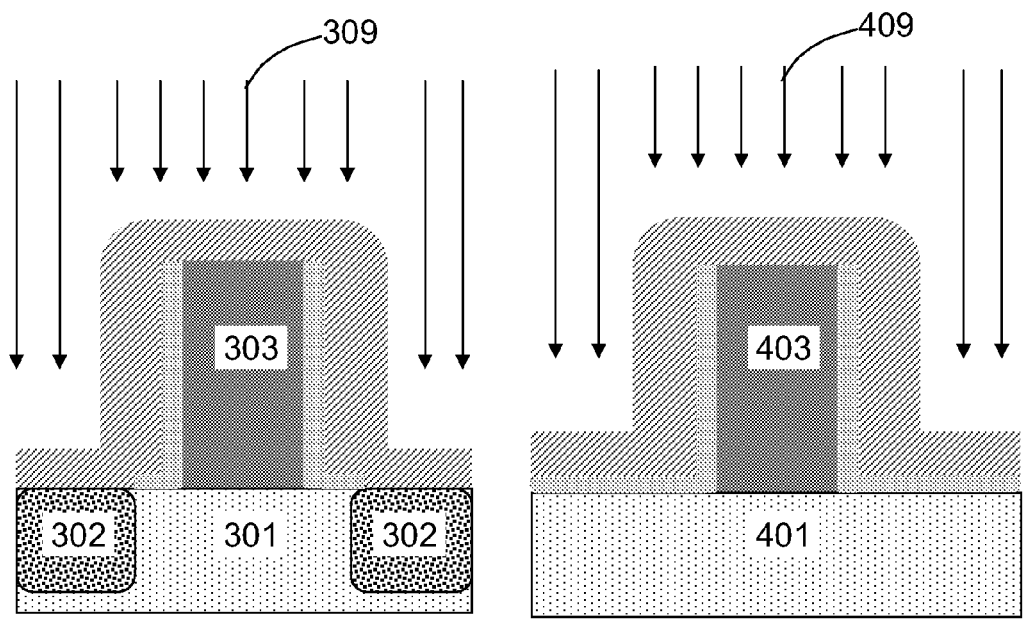
Figure 11:
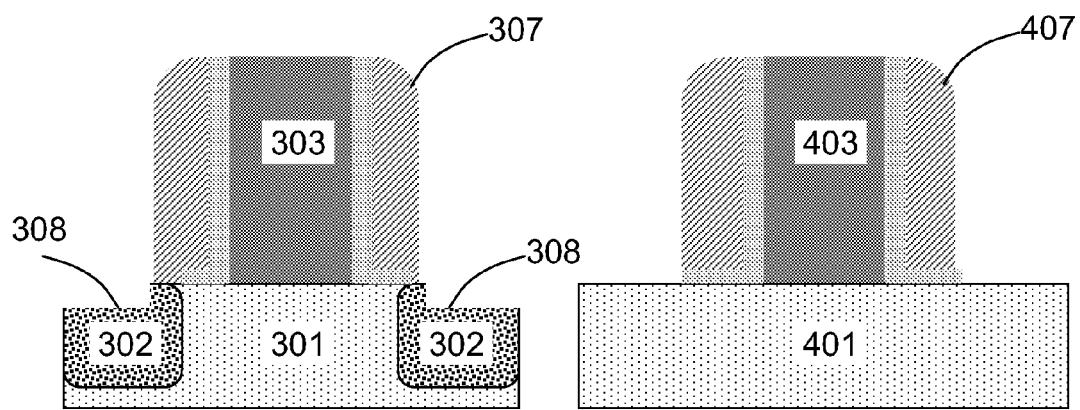

FIG. 7 is a simplified flowchart of a method of manufacturing field-effect-transistors according to embodiments of the present invention. Embodiments of the method 700 may include, as in step 701, forming both pFET and nFET in a conventional way up until a step of forming embedded SiGe in source and drain regions of the pFET. In a next step of 702, embodiments of the method include applying a self-limiting-oxidation process, for example a slot-plate-antenna (SPA) process as a non-limiting example, to the source and drain regions of the pFET. The self-limiting oxidation process may be applied to grow oxide material or a gap-filling layer in such a way as to ensure that, as indicated at step 703, both pFET and nFET have substantially same or close amount of oxide in their source and drain regions respectively. Having approximately the same or substantially similar amount of oxide materials in the source and drain regions of both pFET and nFET greatly reduces or eliminate potential damage or over-etch or erosion to SiGe embedded in the source and drain regions of the pFET. Otherwise, SiGe embedded in the source/drain regions of the pFET would experience erosion due to lack of corresponding oxide covering, during a follow-up process to remove oxide in the source and drain regions of the nFET. The formation of gap-filling layer or oxide on top of the eSiGe in the source and drain regions of pFET is followed by forming or depositing materials suitable for offset spacer (such as oxide or nitride) covering both the pFET and nFET as indicated by step 704. At step 705, a directional etching process, such as a reactive-ion-etching (RIE) process, may be applied to remove unwanted offset spacer materials in the source and drain regions of the FETs, and thus forming offset spacers for both pFET and nFET. After the formation of the offset spacers, conventional techniques such as, for example, ion-implantation and spacer formation may be applied to complete the process of creating pFET and nFET.

While the invention has been described in terms of exemplary embodiments, those skilled in the art will recognize that the invention can be practiced with modifications and in the spirit and scope of the appended claims.

What is claimed is:

1. A method comprising:
forming embedded silicon germanium (eSiGe) in source and drain regions of a p-type field-effect-transistor (pFET) through a disposable spacer process, said disposable spacer process leaving an oxide spacer on top of source and drain extension regions of said pFET forming a height gap between said oxide spacer and said eSiGe;
depositing a gap-filling layer directly on said eSiGe in said source and drain regions and on said oxide spacer on top of said source and drain extension regions in a first process, said gap-filling layer covering said height gap and forming a coplanar surface of said source and drain regions and said source and drain extension regions;
depositing a layer of offset spacer material on top of said gap-filling layer in a second process different from said first process;
etching said offset spacer material and said gap-filling layer, thus forming a set of offset spacers and exposing said eSiGe in said source and drain regions of said pFET; and
finishing formation of said pFET.

2. The method of claim 1, wherein depositing said gap-filling layer comprises growing more oxide on top of said eSiGe in said source and drain regions than on top of said oxide spacer in said source and drain extension regions.

3. The method of claim 2, further comprising growing more oxide on top of said eSiGe of said pFET than on top of a layer of oxide, said layer of oxide directly covering source and drain regions of a n-type field-effect-transistor (nFET) manufactured concurrently with said pFET, said source and drain regions of said nFET has no eSiGe.

4. The method of claim 3, wherein said oxide grown on top of said eSiGe of said pFET has a thickness substantially similar to a combined thickness of said layer of oxide and said oxide grown on top of said layer of oxide, covering source and drain regions of said nFET.

5. The method of claim 2, wherein said first process is a slot-plate-antenna (SPA) process.

6. The method of claim 2, wherein said first process is a low temperature plasma deposition process.

7. The method of claim 1, wherein said gap-filling layer is an oxide layer deposited through either a slot-plate-antenna (SPA) process or a low temperature plasma deposition process.

8. The method of claim 7, wherein etching said gap-filling layer comprises etching said gap-filling layer concurrently with etching an oxide layer which is directly on top of source and drain regions of a n-type field-effect-transistor (nFET) concurrently manufactured with said pFET, wherein said oxide layer on top of said source and drain regions of said nFET has a height that is substantially the same as that of said gap-filling layer.

9. The method of claim 1, wherein etching said offset spacer material comprises applying a directional etching process to remove at least a portion of said offset spacer material deposited on top of said source and drain regions.

10. The method of claim 9, wherein said directional etching process is a reactive-ion-etching (ML) process.

11. A method of forming at least a p-type field-effect-transistor (pFET) and at least an n-type field-effect-transistor (nFET) on a common substrate, the method comprising:
forming embedded silicon germanium (eSiGe) in source and drain regions of said pFET through a disposable spacer process; said disposable spacer process leaving an oxide spacer on top of source and drain extension regions of said pFET forming a height gap between said oxide spacer and said eSiGe and leaving a layer of oxide on top of source and drain regions of said nFET;
depositing a gap-filling layer, in a first process, on said eSiGe in said source and drain regions and on said oxide spacer on top of said source and drain extension regions of said pFET and on said layer of oxide on top of said source and drain regions of said nFET, said gap-filling layer covering said height gap and forming a coplanar surface of said source and drain regions and said source and drain extension regions of said pFET;
depositing a layer of offset spacer material on top of said gap-filling layer in a second process different from said first process;
etching said offset spacer material and said gap-filling layer, thus forming offset spacers and exposing respective said source and drain regions of said pFET and said nFET; and
finishing formation of said pFET and said nFET.

12. The method of claim 11, wherein depositing said gap-filling layer comprises growing more oxide on said eSiGe in said source and drain regions of said pFET than on said layer of oxide covering said source and drain regions of said nFET.

13. The method of claim 12, further comprising growing significantly more oxide on said eSiGe of said pFET than on said layer of oxide that covers said source and drain regions of said nFET.

14. The method of claim 13, wherein said oxide grown on said eSiGe of said pFET has a thickness substantially similar to a combined thickness of said oxide grown on said layer of oxide and said layer of oxide.

15. The method of claim 11, wherein said first process is a slot-plate-antenna (SPA) process or a low temperature plasma deposition.

16. The method of claim 11, wherein said gap-filling layer is an oxide layer having a thickness over said source and drain regions of said pFET being different from a thickness over said source and drain regions of said nFET.

17. The method of claim 11, wherein etching said gap-filling layer comprises etching said gap-filling layer concurrently with etching said layer of oxide which is on top of said source and drain regions of said nFET, said layer of oxide having a height that is substantially the same as that of said gap-filling layer.

18. The method of claim 11, wherein etching said offset spacer material comprises applying a directional etching process to remove a portion of said offset spacer material deposited on top of respective said source and drain regions of said pFET and said nFET.

19. A method of forming at least a p-type field-effect-transistor (pFET) and at least an n-type field-effect-transistor (nFET) on a common substrate, the method comprising:
forming embedded silicon germanium (eSiGe) in source and drain regions of said pFET through a disposable spacer process; said disposable spacer process leaving an oxide spacer on top of source and drain extension regions of said pFET forming a height gap between said oxide spacer and said eSiGe and leaving a layer of oxide on top of source and drain regions of said nFET;
depositing a gap-filling layer, in either a slot-plate-antenna process or a low temperature plasma deposition process, on said eSiGe in said source and drain regions of said pFET and on said layer of oxide on top of said source and drain regions of said nFET;
depositing a layer of offset spacer material on top of said gap-filling layer;
etching said offset spacer material and said gap-filling layer, thus forming offset spacers and exposing respective said source and drain regions of said pFET and said nFET; and
finishing formation of said pFET and said nFET.

20. The method of claim 19, further comprising growing significantly more oxide on said eSiGe of said pFET than on said layer of oxide that covers said source and drain regions of said nFET such that said oxide grown on said eSiGe of said pFET has a thickness substantially similar to a combined thickness of said oxide grown on said layer of oxide and said layer of oxide.

* * * * *